United States Patent
McAlpine et al.

(10) Patent No.: US 9,887,356 B2
(45) Date of Patent: Feb. 6, 2018

(54) 3D PRINTED ACTIVE ELECTRONIC MATERIALS AND DEVICES

(71) Applicants: Michael C. McAlpine, Minneapolis, MN (US); Yong Lin Kong, Cambridge, MA (US)

(72) Inventors: Michael C. McAlpine, Minneapolis, MN (US); Yong Lin Kong, Cambridge, MA (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 15/003,198

(22) Filed: Jan. 21, 2016

(65) Prior Publication Data
US 2016/0218287 A1    Jul. 28, 2016

Related U.S. Application Data

(60) Provisional application No. 62/107,126, filed on Jan. 23, 2015.

(51) Int. Cl.
*H01L 21/00*      (2006.01)
*H01L 51/00*      (2006.01)
(Continued)

(52) U.S. Cl.
CPC ........ *H01L 51/0004* (2013.01); *B29C 64/106* (2017.08); *B29C 64/386* (2017.08); *H01L 51/0012* (2013.01); *H01L 51/56* (2013.01); *B29K 2025/06* (2013.01); *B29K 2079/00* (2013.01); *B29K 2081/00* (2013.01); *B29K 2083/00* (2013.01); *B29K 2105/0073* (2013.01); *B29K 2995/0005* (2013.01); *B33Y 10/00* (2014.12); *B33Y 30/00* (2014.12); *B33Y 50/02* (2014.12); *B33Y 80/00* (2014.12); *G02C 7/04* (2013.01); *G02C 11/10* (2013.01); *H01L 33/005* (2013.01); *H01L 51/0037* (2013.01); *H01L 51/0059* (2013.01); *H01L 51/502* (2013.01); *Y02E 10/549* (2013.01)

(58) Field of Classification Search
USPC .......... 438/28, 34; 700/119; 428/209, 195.1
See application file for complete search history.

(56) References Cited

U.S. PATENT DOCUMENTS

2015/0021628 A1\* 1/2015 Medendorp, Jr. ... H01L 33/0095
257/88

OTHER PUBLICATIONS

Pearce, J. "Building Research Equipment with Free, Open-Source Hardware" Science, vol. 337, pp. 1303-1304, (Sep. 2012).
(Continued)

*Primary Examiner* — Timor Karimy
(74) *Attorney, Agent, or Firm* — Meagher Emanuel Laks Goldberg & Liao, LLP

(57) ABSTRACT

Disclosed is a process whereby diverse classes of materials can be 3D printed and fully integrated into device components with active properties. An exemplary embodiment shows the seamless interweaving of five different materials, including (1) emissive semiconducting inorganic nanoparticles, (2) an elastomeric matrix, (3) organic polymers as charge transport layers, (4) solid and liquid metal leads, and (5) a UV-adhesive transparent substrate layer, demonstrating the integrated functionality of these materials. Further disclosed is a device for printing these fully integrated 3D devices.

18 Claims, 5 Drawing Sheets

(51) Int. Cl.
| | |
|---|---|
| H01L 51/56 | (2006.01) |
| B29C 64/106 | (2017.01) |
| B29C 64/386 | (2017.01) |
| H01L 51/50 | (2006.01) |
| G02C 7/04 | (2006.01) |
| G02C 11/00 | (2006.01) |
| B33Y 10/00 | (2015.01) |
| B33Y 30/00 | (2015.01) |
| B33Y 50/02 | (2015.01) |
| B29K 79/00 | (2006.01) |
| B29K 105/00 | (2006.01) |
| B29K 25/00 | (2006.01) |
| B29K 81/00 | (2006.01) |
| B29K 83/00 | (2006.01) |
| B33Y 80/00 | (2015.01) |
| H01L 33/00 | (2010.01) |

(56) References Cited

OTHER PUBLICATIONS

Qian, L. et al. "Stable and Efficient Quantum-Dot Light-Emitting Diodes Based on Solution-Processed Multilayer Structures" Nature Photonics, vol. 5, pp. 543-547, (Sep. 2011).
Reynolds, K. et al "Self-Assembly of a Functional Electronic Circuit Directed by Capillary Interactions" Applied Physics A. vol. 98, pp. 203-209, (2010).
Rocchini, C. et al. "A Low Cost 3D Scanner Based on Structured Light", Eurographics, vol. 20, No. 3, (2001).
Salvi, J. et al. "Pattern Codification Strategies in Structured Light Systems", Pattern Recognition, vol. 37, pp. 827-849, (2004).
Sargent, E. "Solar Cells, Photodetectors, and Optical Sources from Infrared Colloidal Quantum Dots" Advanced Materials, vol. 20, pp. 3958-3964, (2008).
Sekitani, T. "Stretchable Active-Matrix Organic Light-Emitting Diode Display Using Printable Elastic Conductors" Nature Materials, vol. 8, pp. 494-499, (Jun. 2009).
Sun, K. et al "3D Printing of Interdigitated Li-Ion Microbattery Architectures" Advanced Materials, vol. 25, pp. 4539-4543, (2013).
Supran, G. et al. "QLEDs for Displays and Solid-State Lighting", MRS Bulletin, vol. 38, pp. 703-711, (Sep. 2013).
Tan, Z. et. al. "Bright and Color-Saturated Emission from Blue Light-Emitting Diodes Based on Solution-Processed Colloidal Nanocrystal Quantum Dots", Nano Letters, vol. 7, No. 12, pp. 383-3807, (2007).
Tian, B. et al. "Three-Dimensional, Flexible Nanoscale Field-Effect Transistors as Localized Bioprobes" Science, vol. 329, pp. 830-834, (Aug. 2010).
Wendel, B. et al. "Additive Processing of Polymers" Macromolecular Materials and Engineering, vol. 293, pp. 199-809, (2008).
Wood, V. et al. "Inkjet-Printed Quantum Dot-Polymer Composites for Full-Color AC-Driven Displays" Advanced Materials, vol. 21, pp. 2151-2155, (2009).
Xu, L. et al. "3D Multifunctional Integumentary Membranes for Spatiotemporal Cardiac Measurements and Stimulation Across the Entire Epicardium" Nature Communications, vol. 5. (2014).
Yao, H. et al. "A Contact Lens with Embedded Sensor for Monitoring Tear Glucose Level", Biosensors and Bioelectronics, vol. 26, pp. 3290-3296, (2011).
Zhao, C. et al "Three Dimensional (3D) Printed Electrodes for Interdigitated Supercapacitors", Electrochemistry Communications, vol. 41, pp. 20-23, (2014).
Zhao, J. et al. "Efficient CdSe/CdS Quantum Dot Light-Emitting Diodes Using a Thermally Polymerized Hole Transport Layer" Nano Letters, vol. 6, No. 3, pp. 463-467, (2006).
Zheng, W. et al. "Fabrication of Multicomponent Microsytems by Directed Three-Dimensional Self Assembly" Advanced Functional Materials, vol. 15, No. 5, (2005).
Zhu, T. et al. "Mist Fabrication of Light Emitting Diodes with Colloidal Nanocrystal Quantum Dots" Applied Physics Letters, vol. 92. (2008).
Kim, D. et al. "Dissolvable Films of Silk Fibroin for Ultrathin Conformal Bio-Integrated Electronics" Nature Materials, vol. 9, pp. 511-517, (Jun. 2010).
Nguyen, T. et al. "Piezoelectric Nanoribbons for Monitoring Cellular Deformations", vol. 7, pp. 587-593 (Sep. 2012).
Shmuylovich, L. et al. "Surface Morphology of Drying Latex Films: Multiple Ring Formation" Langmuir, vol. 18, pp. 3441-3445, (2002).
Symes, M. et al. "Integrated 3D-Printed Reactionsware for Chemical Synthesis and Analysis" Nature Chemistry, vol. 4, pp. 349-354, (May 2012).
Adams et al. "Conformal Printing of Electrically Small Antennas on Three-Dimensional Surfaces" Advanced Materials, vol. 23; pp. 1335-1340, (2011).
Ahn et al. "Heterogeneous Three-Dimensional Electronics by Use of Printed Semiconductor Nanomaterials" Science, vol. 314, pp. 1754-1757, (Dec. 2006).
Ahn et al. "Omnidirectional Printing of Flexible, Stretchable, and Spanning Silver Microelectrodes" Science, vol. 323, pp. 1590-1593, (Mar. 2009).
Alivisatos A. P., "Semiconductor Clusters, Nanocrystals, Quantum Dots" Science, vol. 271, pp. 933-937, (Feb. 1996).
Anikeeva, et al. "Electoluminescence from a Mixed Red-Green-Blue Colloidal Quantum Dot Monolayer", Nano Letters, vol. 7, No. 8. pp. 2196-2200, (2007).
Bandodkar, et al. "Non-Invasive Wearable Eletrochemical Sensors: a Review" Trends in Biotechnology, vol. 32, No. 7, pp. 363-371, (Jul. 2014).
Boley et al. "Direct Writing of Gallium-Indium Alloy for Stretchable Electronics", Advanced Functional Materials, vol. 24, pp. 3501-3507; (2014).
Boncheva et al. "Biomimetic self-assembly of a functional asymmetrical electronic device" PNAS, vol. 99, No. 8, pp. 4937-4940, (Apr. 2002).
Chen et al. "Compact Hihg-Quality CdSe-CdS Core-shell nanocrystals with narrow emission linewidths and suppressed blinking" Nature Materials, vol. 12., pp. 445-451, (May 2013).
Chiechi et al. "Eutectic Gallium-Indium (EGaIn): A Moldable Liquid Metal for Electrical Characterization of Self-Assembled Monolayers" Angewandte Chemistry, vol. 47, pp. 142-144; (2008).
Coe et al. "Electroluminescence from Single Monolayers of Nanocrystals in Molecular Organic Devices" Nature, vol. 420, pp. 800-803, (Dec. 2002).
Colvin et al. "Light-Emitting Diodes Made from Cadmium Selenide Nanocrystals and Semiconducting Polymer" Nature, vol. 370, pp. 354-357, (Aug. 1994).
Deegan et al. "Capillary Flow as the Cause of Ring Stains from Dried Liquid Drops" Nature, vol. 389, pp. 827-829, (Oct. 1997).
Dickey et al. "Eutectic Gallium-Indium (EGaIn): A Liquid Metal Alloy for the Formation of Stable Structures in Microchannels at Room Temperature" Advanced Functional Materials, vol. 18. pp. 1097-1104, (2008).
Gates, B. "Flexible Electronics" Science, vol. 323, pp. 1566-1567, (Mar. 2009).
Gossler et al. "GaN-Based Micro-LED Arrays on Flexible Substrates for Optical Cochlear Implants" Journal of Physics, vol. 47, (2014).
Gracias et al, "Forming Electrical Networks in Three Dimensions by Self-Assembly" Science, vol. 289, pp. 1170-1172, (Aug. 200).
Gur et al. "Air-Stable All-Inorganic Nanocrystal Solar Cells Processed from Solution" Science, vol. 310, pp. 462-465, (Oct. 2005).
Haverinen et al. "Inkjet Printing of Light Emitting Quantum Dots", Applied Physics Letters, vol. 94, (2009).
Haverinen et al. "Inkjet Printed RGB Quatum Dot-Hybrid LED" Journal of Display Technology, vol. 6, No. 3, (Mar. 2010).
Hu et al. "Marangoni Effect Reverses Coffee-Ring Depositions" The Journal of Physical Chemistry, vol. 110, No. 14 (2006).
Hu, et al. "Meniscus-Confined Three-Dimensional Electrodeposition for Direct Writing of Wire Bonds" Science, vol. 329, pp. 313-316, (Mar. 2016).

(56) References Cited

OTHER PUBLICATIONS

Jarvis, R. "A Perspective on Range Finding Techniques for Computer Vision" IEEE Transactions on Pattern Analysis and Machine Intelligence, vol. PAMI-5, No. 2, (Mar. 1983).
Javey et al. "Layer-by-Layer Assembly of Nanowires for Three-Dimensional, Multifunctional Electonics" Nano Letters, vol. 7, No. 3, pp. 773-777, (2007).
Kim, D. et al "Epidermal Electronics" Science, vol. 333, pp. 838-843, (Aug. 2011).
Kim, D. et al. "Materials for Multifunctional Balloon Catheters with Capabilities in Cardiac Electrophysiological Mapping and Ablation Therapy." Nature Materials, vol. 10. pp. 316-323, (Apr. 2011).
Kim, R. et al. "Waterproof AlInGaP Optoelectronics on Stretchable Substrates with Applications in Biomedicine and Robotics" Nature Materials, vol. 9. pp. 929-937, (Nov. 2010).
Kim, T. et al. "Full-Color Quantum Dot Displays Fabricated by Transfer Printing" Nature Photonics, vol. 5. pp. 176-182, (Mar. 2011).
Kim, T. et al. "Bright and Stable Quantum Dots and Their Applications in Full-Color Displays" MRS Bulletin, vol. 38, pp. 712-720, (Sep. 2013).
Kim, T. et al. "Injectable, Cellular-Scale Optoelectronics with Applications for Wireless Optogenetics" Science, vol. 340, pp. 211-2016, (Apr. 12, 2013).
Konstantos, G. et al. "Ultrasensitive Solution-Cast Quantum Dot Photdetectors" Nature, vol. 442, pp. 180-183, (Jul. 2006).
Kwak, J. et al. "Bright and Efficient Full-Color Colloidal Quantum Dot Light-Emitting Diodes Using an Inverted Device Structure" Nano Letters, vol. 12, pp. 2362-2366, (2012).
Ladd, C. et al. "3D Printing of Free Standing Liquid Metal Microstructures" Advanced Functional Materials, vol. 25. pp. 5081-5085, (2013).
Lee, M. "High-Performance, Transport, and Stretchable Electrodes Using Graphene-Metal Nanowire Hybrid Structures" Nano Letters, vol. 13, pp. 2814-2821, (2013).
Lewis, J. "Direct Ink Writing of 3D Functional Materials" Advanced Functional Materials, vol. 16, pp. 2193-2204, (2006).
Lipomi, D. et al. "Stretchable Organic Solar Cells", Advanced Materials, vol. 23, pp. 1771-1775, (2011).
Liu, J. et al. "Nultifunctional Three-Dimensional Macroporous Nanoelectronic Networks for Smart Materials", PNAS, vol. 110, No. 17, pp. 6694-6699, (Apr. 23, 2013).
Lopes, A. et al. "Integrating Stereolithography and Direct Print Technologies for 3D Structural Electronics Fabrication" Rapid Prototyping Journal, vol. 18, Issue 2, pp. 129-143, (2012).
Malone, E. et al, "Fab@Home: The Personal Desktop Fabricator Kit", Rapid Prototyping Journal, vol. 13, Iss. 4, pp. 245-255, (2007).
Mannoor, M. et al. "Graphene-Based Wireles Bacteria Detection on Tooth Enamel" Nature Communications, vol. 1767, (2012).
Mannoor, M et al. "3D Printed Bionic Ears", Nano Letters, vol. 13, pp. 2634-2639, (2013).
Moffat, J. et al. "Effect of TiO2 Nanoparticles on Contact Line Stick-Slip Behavior of Volatile Drops", Journal of Physical Chemistry B, vol. 113, pp. 8860-8866, (2009).
Morin, S. et al. "Using "Click-e-Bricks" to Make 3D Elastomeric Structures" Advanced Materials, vol. 26, pp. 5991-5999, (2014).
Motoyoshi, M. et al. "Through-Silicon Via (TSV)" Proceedings of the IEEE, vol. 97, No. 1, pp. 43-48, (Jan. 2009).
Murphy, S. et al. "3D Bioprinting of Tissues and Organs" Nature Biotechnology, vol. 32, No. 8. (Aug. 2014).
Muth, J. et al. "Embedded 3D Printing of Strain Sensors with Highly Stretchable Elastomers" Advanced Materials, vol. 26, pp. 6307-6312, (2014).
Nam, S. et al. "Vertically Integrated, Three-Dimensional Nanowire Comlementary Metal-Oxide-Semiconductor Circuits" PNAS, vol. 16, No. 50, pp. 21035-21035, (Dec. 2009).
Ouyang, J. et al. "On the Mechanism of Conductivity Enhancement in Poly (3,4-Ethylenedioxythiophene): Poly (Styrene Sulfonate) Film through Solvent Treatment" Polymer, vol. 45, pp. 8443-8450, (2004).
Park, J. et al. "Contol of Colloidal Particle Deposit Patterns within Picoliter Droplets Ejected by Ink-Jet Printing" Langmuir, vol. 22, No. 8, pp. 3506-3513, (2006).
Pattantyus-Abraham, A. et al "Depleted-Heterojunction Colloidal Quantum Dot Solar Cells" ACS Nano, vol. 4, No. 6, pp. 3374-3380, (May 2010).

\* cited by examiner

3D PRINTED ACTIVE ELECTRONIC MATERIALS AND DEVICES

CROSS-REFERENCE TO RELATED APPLICATIONS

This application claims benefit of U.S. Provisional Application No. 62/107,126, filed Jan. 23, 2015, which is hereby incorporated in its entirety by reference.

STATEMENT REGARDING FEDERALLY SPONSORED RESEARCH OR DEVELOPMENT

This invention was made with government support under Grant No. FA9550-12-1-0368 awarded by the Air Force Office of Scientific Research (AFOSR) and Grant No. D12AP00245 awarded by the Defense Advanced Research Projects Agency (DARPA). The government has certain rights in the invention.

BACKGROUND OF THE INVENTION

Three-dimensional ("3D") printing is a technique that is starting to gain significant attention and commercial interest. However, to date, 3D printing has been limited to components such as plastic parts and metal lines, as well as to specific plastics, passive conductors, and a few biological materials. A significant advance would be the ability to 3D print functional active electronic materials and devices in a variety of geometries, beyond the two dimensional ("2D") constraints of traditional microfabrication semiconductor processing. Developing the ability to 3D print various classes of materials possessing distinct properties could enable the freeform generation of active electronics in unique functional, interwoven architectures. Achieving seamless integration of diverse materials with 3D printing is a significant challenge that requires overcoming discrepancies in material properties in addition to ensuring that all the materials are compatible with the 3D printing process.

The freeform generation of active electronics in unique architectures which transcend the planarity inherent to conventional microfabrication techniques has been an area of increasing scientific interest. Three-dimensional large-scale integration (3D-LSI) can reduce the overall footprint and power consumption of electronics, and is usually accomplished via stacks of two dimensional semiconductor wafers, in which interconnects between layers are achieved using wire-bonding or through-silicon vias. Overcoming this "2D barrier" has significant potential applications beyond improving the scalability in semiconductor integration technologies. For instance, the ability to seamlessly incorporate electronics into three-dimensional constructs could impart functionalities to biological and mechanical systems, such as advanced optical, computation or sensing capabilities. For example, integration of electronics on otherwise passive structural medical instruments such as catheters, gloves, and contact lenses are critical for next generation applications such as real-time monitoring of physiological conditions. Such integration has been previously demonstrated via meticulous transfer printing of pre-fabricated electronics and/or interfacing materials via dissolvable media such as silk on nonplanar surface topologies. An alternative approach is to attempt to interweave electronics in three dimensions from the bottom up. Yet, attaining seamless interweaving of electronics is challenging due to the inherent material incompatibilities and geometrical constraints of traditional micro-fabrication processing techniques.

BRIEF SUMMARY OF THE INVENTION

Disclosed herein are novel strategies directed at the seamless interweaving of three-dimensional active electronic devices.

Also disclosed is a method of making a device involving 3D printing an active electronic device composed of semiconducting materials. This method may also include 3D printing of elastomeric matrices, organic polymers, solid and liquid metal leads, nanoparticle semiconductors, and/or transparent substrate layers. This method may also involve identification of at least one material of an electrode, semiconductor, or polymer that possesses a desirable functionality and that exists in a printable format, and then patterning that material via direct dispensing from a CAD-designed construct onto a substrate. Conformal 3D printing, such as printing onto a curved surface like a contact lens, may also require scanning the topology of the surface of the substrate, and providing that information to the CAD system. The substrate can be a variety of desirable materials exhibiting flat or non-flat surface, such as biologics, glass, polyamides, or 3D printed substrates. These disclosed semiconductors may provide a multitude of end uses, such as wearable displays and/or continuous on-eye glucose sensors. These devices may also include a range of functionality, from including quantum dot light-emitting diodes (QD-LEDs), MEMS devices, transistors, solar cells, piezoelectrics, batteries, fuel cells, and photodiodes. The disclosed method may also incorporate other classes of nanoscale functional building blocks and devices, including metallic, semiconductor, plasmonic, biological, and ferroelectric materials. The disclosed method may also involve several steps for printing a semiconducting material, including providing a syringe with a predetermined nozzle tip size, loading ink comprising the semiconducting material into the syringe, placing the syringe under vacuum, turning off the vacuum, lowering the syringe until the ink at the nozzle tip touches the substrate, holding the syringe in place for a predetermined period of time, and raising the syringe and placing the syringe under vacuum.

The disclosed method may also include connecting two active electronic devices together via a printed conductive pattern.

In producing an active electronic device, the disclosed method may also include dissolving or suspending a printable material in a composition comprising at least one orthogonal solvent, and may involve dissolving or suspending the printable material at a concentration of less than 1 wt %, often lower than 0.20 wt %.

Also disclosed is a method of making a particular active electronic device with a 3D printer, a quantum dot light emitting diode (QD-LED), involving printing circular rings connected to contact pads on a substrate using a conductive nanoparticle ink, such as silver, annealing the printed conductive nanoparticles, dispensing a conductive polymer, such as poly(3,4-ethylenedioxythiophene) polystyrene sulfonate (PEDOT:PSS), at approximately the center of the printed circular ring until the contact line touches the printed circular ring, heating the substrate, dispensing and annealing a solution comprising between about 0.05 and about 0.20 wt % Poly(N,N'-bis-4-butylphenyl-N,N'-bisphenyl)benzidine (poly-TPD) in chlorobenzene, dispensing CdSe/ZnS QDs in a co-solvent mixture onto the annealed poly-TPD, drying the QDs, printing a liquid metal, such as EGaIn, at approximately the center of the printed circular ring, printing a UV adhesive around the liquid metal to insulate it from the silver nanop article ("AgNP") anode ring, curing the printed adhesive with a laser, printing conductive silicone, and printing and curing ultraviolet (UV) adhesive to encapsulate the printed QD-LED. This method may also require printing conductive silicone as vertical interconnects along with room temperature vulcanized (RTV) silicone to connect the exposed liquid metal to the contact pads and to connect the anode and cathode of different QD-LED layers so as to 3D print an array of QD-LEDs. The disclosed method may also involve scanning the surface using a 3D scanner to generate a geometrically faithful computer model of the surface, providing the computer model to the 3D printer, and adjusting the 3D printing process to enable conformal 3D printing on a substrate having a non-flat, 3D surface or a flat surface which has structural elements on the surface, for example, a rough flat surface.

Also disclosed is a 3D Printer configured for printing these active electronic devices, which requires a plurality of syringes, each comprising a barrel and nozzle, a printer stage located under the plurality of syringes, a printer stage heating and cooling unit, at least one pressure regulator connected via tubing to at least one of the plurality of syringes, and a UV laser.

DETAILED DESCRIPTION OF THE INVENTION

The novel methods and systems described herein are aimed at enabling the seamless interweaving of electronics in three dimensional devices, generally built from the bottom up.

The present invention discloses a method of making a device, which comprises 3D printing an active electronic device. These devices generally contain semiconducting materials, which include but are not limited to silicon, silicon-based compounds, germanium, germanium based compounds, cadmium-based compounds, and gallium-based compounds. Those skilled in the art will recognize that this list is non-exhaustive.

The present invention also may require 3D printing of additional materials or layers beyond a semiconductive material. Those layers may include an elastomeric matrix, organic polymers as charge transport layers, solid or liquid metal leads, nanoparticle semiconductors, and a UV-adhesive transparent substrate layer. Other classes of nanoscale functional building blocks and devices may also be incorporated, including metallic, semiconductor, plasmonic, biological, and ferroelectric materials.

Figure 1:
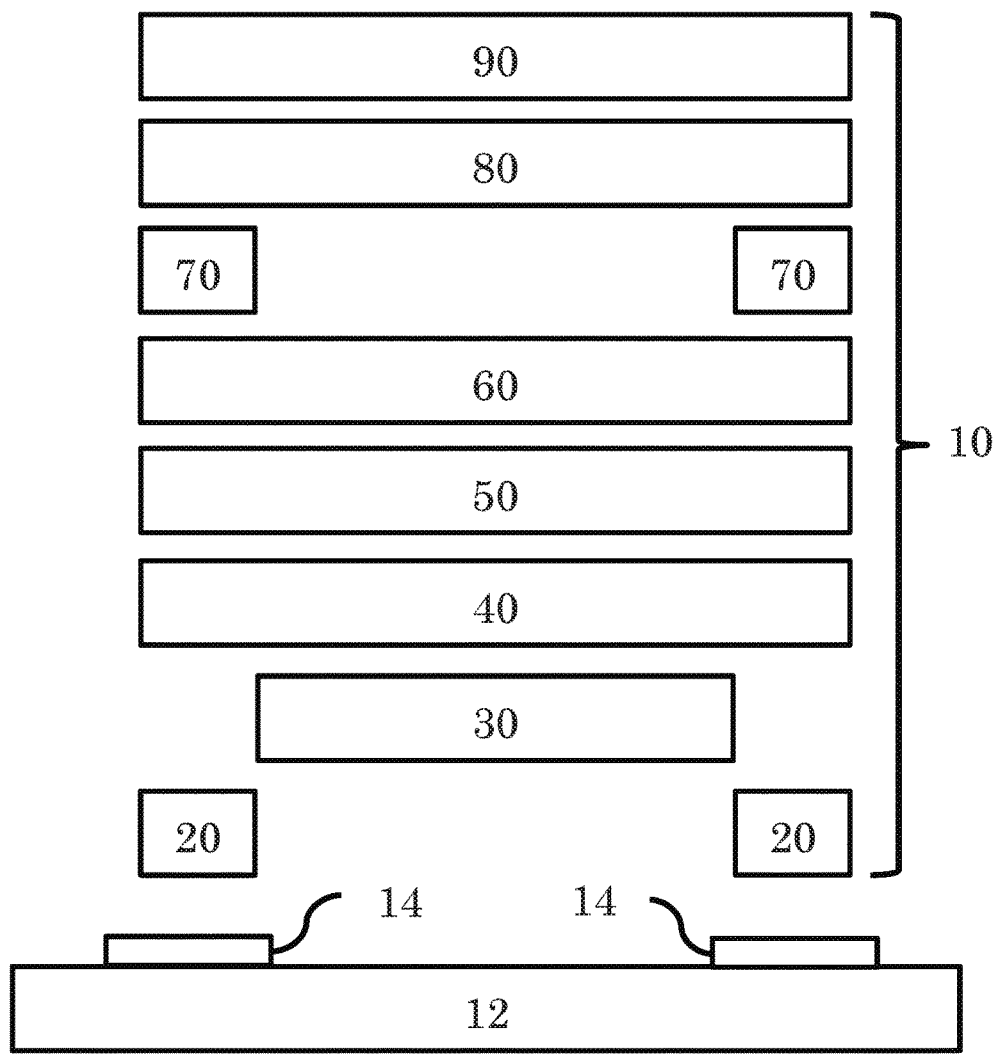
FIG. 1 is a diagram of one embodiment of a 3D printed device.

As illustrated in FIG. 1, the active electronic device 10 may include multiple layers. The device 10 may include a connector layer 20, which may comprise silver nanoparticles. In FIG. 1, connector layer 20 is shown as a having a ring-shaped configuration. While this configuration may be appropriate in some instances, other configurations may be desirable. An adhesive layer 30 may be required to ensure adhesion to a substrate 12 which may have contact pads 14 on it. An anode layer 40 may then be printed, which may include materials such as PEDOT:PSS. The device may then have a hole transport layer 50, such as Poly-TPD, printed, followed by a semiconductor layer 60, perhaps an emission layer using CdSe-ZnS quantum dots. An insulation layer 70 may then be required. Similar to the connector layer 20, the insulation layer 70 is shown as having a ring-shaped configuration in FIG. 1. Such a configuration may not be necessary in all devices, and other configurations may be desirable. A cathode layer 80, such as aluminum or eutectic gallium indium liquid metal, may then be printed, and a final connection layer 90 can optionally be included. One skilled in the art will recognize that this is merely an illustration of one embodiment, and alternate arrangements of layers fall within the scope of this invention, This process often requires identifying at least one material that possesses desired functionalities, including conductors, semiconductors, and insulators, and is not restricted to metals or polymers.

Materials for utilization in this process should generally be in a printable format. That is, they can be printed directly as-is, they can be modified to allow them to print, or they can be combined with another material to enable them to print. This can include, but is not limited to, chemically or physically manipulating a material, heating or cooling a material, dissolving or suspending a material in at least one solvent, surface coating a material, or introducing a processing aid.

As one example, Polyacrylic acid-capped AgNPs were synthesized by modifying the synthesis method disclosed by Ahn et al. Specifically, the particles were precipitated via centrifugation at 7,830 rpm for 1 hour (Eppendorf, Hauppauge, N.Y.) and were homogenized at a speed of 100 rpm for 10 min using an automatic solder paste mixing machine (Japan Unix Co, Akasaka, Japan). The morphology of the printed AgNP was characterized by scanning electron microscopy (Quanta 200 FEG Environmental SEM). The silver precipitate was characterized with a transmission electron microscope (Philips CM100). The particle sizes were measured from the TEM image and found to have an average diameter of 8.2±5.0 nm. The printed AgNP had a resistivity of 10 $\Omega$/cm after an hour of heating at 200° C.

As another example, Poly-TPD (American Dye Source, Quebec, Canada) was dissolved in chlorobenzene (Fisher Scientific, Pittsburgh, Pa.) and dispensed on top of printed PEDOT:PSS. In contrast to spin coating, in which a significantly higher concentration (1.5 wt %) is typically used as the starting solution, a device with appropriate diode characteristics was obtained when the concentration was reduced 10-18 fold (around 0.0825 wt % to around 0.15 wt %) during direct ink 3D printing. Concentrations of 1.5 wt % resulted in non-uniform films with bulk resistances that were too high for this particular application (2.44×10$^9$ $\Omega$ at 10 V). Significantly diluted concentrations of poly-TPD (0.015 wt %) yielded unstable device performances due to the discontinuous surface of the poly-TPD layer. It should be noted that although this particular combination had a workable range of between about 0.02 wt % and about 0.20 wt %, one skilled in the art will recognize that the exact maximum and minimum concentrations within which a given combination of materials and solvents will produce a continuous surface that is thin or thick enough to meet a particular application requirement will vary depending on the materials and solvents involved.

In one particular embodiment, the material is dissolved or suspended in a composition that comprises an orthogonal solvent. Utilizing orthogonal solvents minimizes the risk of compromising the integrity of the underlying layers during the printing process. In another embodiment, the material is dissolved or suspended in a composition that comprises two orthogonal solvents. In a preferred embodiment, the material is present at between about 0.02 wt % and about 0.20 wt % in a composition comprising at least one solvent.

This method can exploit solutal Marangoni effects, which suppress the accumulation of suspended particles in a drying droplet of solution near the pinned contact line that is due to the capillary flow, i.e. the so-called coffee ring pattern. The Marangoni effect is known to be due to the different surface tensions associated with the two liquid components of a binary mixture, which create a solutal Marangoni flow. Under optimal conditions, the particles may deposit in a self-assembled uniform layer. Thus, by appropriately selecting orthogonal solvents, this method can produce uniform coatings that utilize significantly less concentrated solutions of the material than what is seen in spin-coating.

As one example, CdSe/ZnS QDs (Ocean NanoTech, San Diego, Calif.) was dissolved in toluene (Sigma Aldrich, St. Louis, Mo.) to 10 mg/ml. Dichlorobenzene (Sigma Aldrich, St. Louis, Mo.) and toluene were then added to dilute the concentration to 3 mg/ml with a volume fraction of 0-50% dichlorobenzene. A 25 mm×25 mm indium tin oxide (ITO) coated glass slide (Sigma Aldrich, St. Louis, Mo.) was cleaned with water, acetone and isopropanol for 15 minutes each. The ITO was then dried with nitrogen and heated to 150° C. for 15 minutes. A 0.8 wt % PEDOT:PSS (Sigma Aldrich, St. Louis, Mo.) solution was then spin coated and heated at 150° C. with a hotplate for 15 minutes. A 1.5 wt % poly-TPD (American Dye Source, Quebec, Canada) solution was then spin coated and heated at 110° C. for 30 minutes. 0.5 µL of prepared QD solution was then dispensed with an auto micropipette. The experiments were conducted under relative humidity of 22.5±1%, and temperature 23.5±0.5° C. A hood was installed on top of the droplet to minimize disturbance from the environment while the mixture droplets evaporate. The QD droplet evaporation was visualized with the excitation from a 527 nm fluorescent lamp. The emission was filtered with a 540 nm filter and the fluorescent signal was recorded using a CCD camera. The lamp power was kept constant throughout the experiment, so that the intensity captured correlated with the deposition concentrations of the QDs of different droplets. The film heights were measured with a surface profiler (KLATencor/P-15). It can be seen that for the pure toluene case, the contact line recedes as evaporation occurs. Therefore, most QDs are concentrated in a small region near the droplet center and distributed over a significantly smaller region than the target area. Further characterization by profilometry at a 1 mm radius shows a maximum height of 5.6 µm at the receded coffee ring and low uniformity of the QD layer as indicated by a root-mean-square roughness value (RRMS) of 900 nm at the inner circular region. This lack of uniformity in the printed QDs may not be desirable, as it can cause significant difficulties in subsequent printing steps, reducing device performance and yield.

A binary mixture of 80% toluene and 20% dichlorobenzene allows the contact line to remain pinned everywhere, resulting in the formulation of a more uniformly distributed QD layer, except at the outer region of the contact line. For example, at the same 1 mm radius region, the profilometer measurement shows a maximum height of only 260 nm and RRMS of 110 nm. The annular ring pattern deposition observed is due to the stick-and-slip mode of the contact line movement. Further increasing the dichlorobenzene concentration did not improve QD layer uniformity in this example.

The present invention further discloses how patterns may be created. While these materials may simply be dispensed at a fixed location or by in a pattern that is hard-coded into a unit controlling the printer (as might exist in a high speed manufacturing facility), the present invention also incorporates patterning of at least one identified material via direct dispensing from a CAD-designed construct onto a substrate.

Further, the CAD-designed constructs may be created utilizing designs for surfaces created entirely within the CAD system, one embodiment of this invention also envisions a more accurate method of conformal printing. This method involves the additional steps of scanning the topology of the surface of a substrate that is desired to be printed upon, then providing the information derived from the scanning step into the CAD design of the device. The substrate being printed upon may or may not have a variety of characteristics, or a combination thereof, including being flat, biological, porous, glass, polymeric, or a 3D printed substrate. In a particular embodiment, the surface is a contact lens.

The type of features being printed may include, but is not limited to, quantum dot light-emitting diodes ("QD-LEDs"), MEMS devices, transistors, solar cells, piezoelectrics, batteries, fuel cells, and photodiodes. In one embodiment, these features may combine to form, for example, a wearable display, and/or a continuous on-eye glucose sensor.

As one example, a hard contact lens (Winchester Optical Company, Elmira, N.Y.) was imaged using a commercially available 3D structured-light scanner (SLS-1, David Visions, Germany) which resulted in geometrically faithful computer models of the contact lens surface, here representing the target curvilinear surface for conformal printing of QD-LEDs. Prior to scanning, a thin layer of contrast agent was applied to the lens to increase the density of data acquired per scan. The lens was then mounted at the center of a motorized rotational stage (Thorlabs, Newton, N.J.). The scanner was calibrated and focused following vendor-provided protocols. Raw scan data was acquired without the use of scanning software-associated smoothing or filtering algorithms and was saved in wavefront OBJ data format. A total of eight scans of the lens were obtained at different rotational positions of the stage, ranging from 0 to 360 degrees in 45 degree intervals.

The individual wavefront files were subsequently aligned and assembled using a mesh editing software (MeshLab) which resulted in a 3D mesh reconstruction of the contact lens. Briefly, alignment and assembly were carried out by point-based gluing alignment of the individual scans using approximately six identification points per scan. The data was then converted to a single 3D mesh by flattening visible layers, filling holes, and reconstructing a global surface.

The scanned model was then imported to Solidworks Premium 2014 with a ScanTo3D feature before the QD-LED CAD model was conformed to the surface of the model. A layer of UV adhesive (Novacentrix, Austin, Tex.) was then printed on the scanned hard contact lens as an adhesion layer. The adhesion layer was then cured with a handheld UV-lamp (285 nm) for an hour. The QD-LED was then printed, in which a concentration of 3 mg/ml solution of orange-red QDs (Ocean NanoTech, San Diego, Calif.) and 50% dichlorobenzene was used to achieve electroluminescence on the acrylate-based adhesive. To heat the layers without damaging the substrate, the device was heated near the top layers via inversion, with a 1 mm air gap between the surface of the contact lens and the hot plate. The heating time was extended until the AgNP was sintered. The substrate was observed periodically and the gap was adjusted to prevent charring. For other layers, the hot plate temperature of the inverted configuration was increased until the temperature of the surface reached the prescribed surface temperature.

As another example, a 3D CAD model, including the substrate and QD-LED array, were designed and rendered using Solidworks Premium 2014 (Dassault Systèmes, Vélizy-Villacoublay Cedex, France), then sent to the 3D printer for printing. Contact pads and connectors were printed on a glass substrate with synthesized silver nanoparticles (33 ga, 80 µm gap, 50 psi pressure, 0.5 mm/s translation speed). A room temperature vulcanized silicone sealant (Loctitie, Rocky Hill, Conn.) was printed as the structural material. For silicone printing, tapered nozzle sizes ranged from 20 ga to 25 ga (610 µm to 250 µm) and the parameters were tailored based on the feature size, resolution and print speed. The print gap was maintained at 80% of the nozzle inner diameter, and the syringe barrel pressure ranged from 20-50 psi, depending on the translation speed. Prior to the printing of QD-LEDs on the printed silicone substrate, the UV adhesive (Novacentrix, Austin, Tex.) was printed and cured with a UV laser (405 nm) and a handheld UV lamp (285 nm). Multicolor QD-LEDs were then printed using the procedures described above. To heat the layers without damaging the substrate, the device was inverted and heated near the top layers, with a ~1 mm air gap between the surface of the contact lens and the hot plate. The heating time was extended until the printed AgNPs were sintered. The substrate was observed periodically and the gap was adjusted to prevent charring. For other layers, the hot plate temperature of the inverted configuration was increased until the temperature of the surface reached the prescribed surface temperature.

One skilled in the art will recognize that the characteristics of the substrate and the interaction between the substrate and the device will also need to be taken into consideration. In some cases, the device may be printed directly onto the substrate. In others, an adhesive layer may sometimes be required to allow the printing of a device onto a desired substrate.

As one example of this, the suitability of five different printable transparent polymers as QD-LED substrates was assessed. The contact angle of a PEDOT:PSS ink on (A) Novacentrix, PRO-001 UV, (B) polyvinyl alcohol (PVA), (C) polydimethylsiloxane (PDMS) (D) Norland Products Inc, UVS 91, (E) bifunctional acrylate monomers with photoinitiator (polyacrylate), and (F) glass, were investigated. PRO-001 UV consists of a blend of acrylate monomers and oligomers. UVS 91 consisted of mercapto-esters and tetrahydrofurfuryl methacrylate. The polyacrylate substrate consisted of ethoxylated bisphenol a-dimethacrylate bifunctional monomers and 1 wt % 2,2-dimethoxy-2-phenylacetophenone photoinitiator. The contact angle represents the solid-liquid adhesion energy per unit area. It was found the PRO-001 UV acrylate adhesive with a contact angle of 16±4° exhibited good adhesion with PEDOT:PSS. It was found that the PEDOT:PSS film was conductive on PRO-001 UV adhesive without sacrificing significant transparency. On the contrary, PEDOT:PSS does not adhere on hydrophobic substrates such as PDMS, and is non-conductive on substrates such as PVA. Based on these observations, the acrylate-based UV adhesive, PRO-001 UV was selected as a printable transparent substrate for subsequent experiments. However, had the device needed to be printed upon PDMS or PVA, an adhesive layer would have been required.

The present invention also discloses an embodiment wherein the semiconducting materials are printed by a method that involves first providing a syringe with a pre-determined nozzle tip size. One skilled in the art will recognize that the nozzle tip size will vary significantly based on several factors, including but not limited to material flow characteristics, printing resolution required, print speed required, and the pressure the inks will be under when printing. The ink comprising the semiconducting material is then loaded into the syringe, and the syringe is placed under vacuum to prevent material from dripping from the syringe. When ready to print, the vacuum is turned off; the syringe is lowered until approximately when the ink at the nozzle tip touches the substrate. The amount of ink extruded was controlled by controlling the hold-time in this position; generally this is done by holding the syringe in place for a pre-determined period of time. The syringe is then raised and placed under vacuum to prevent dripping.

Figure 2:
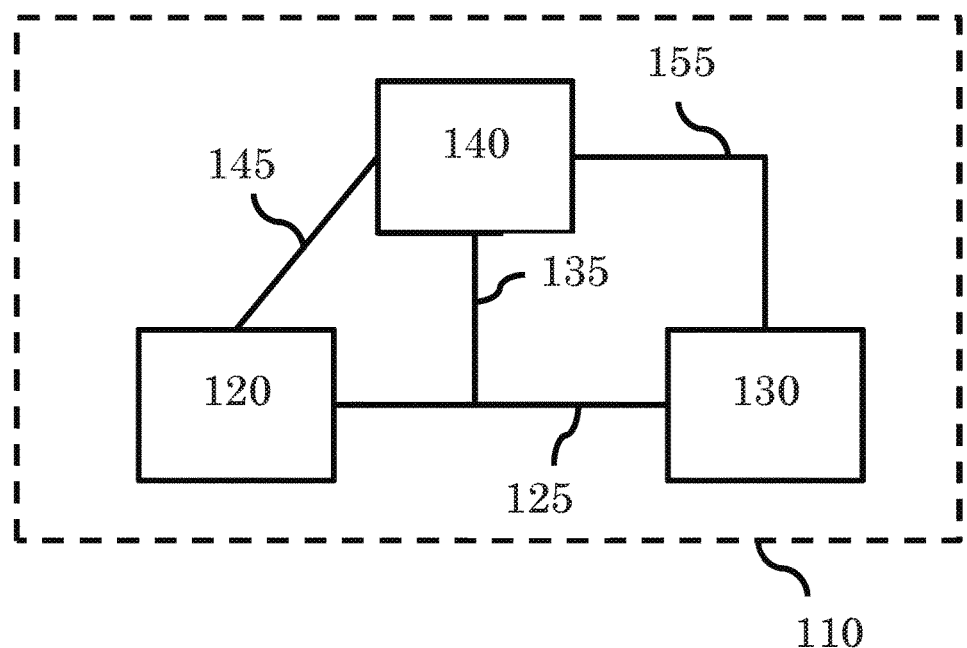
FIG. 2 is a diagram illustrating connections between active electronic devices within a single device.

The present invention also envisions a device containing multiple active electronic devices within it. Further disclosed is printing a conductive pattern connecting a first active electronic devices and a second active electronic device. An example of this is in wearable technology—a solar cell could be connected to a QD-LED. As illustrated in FIG. 2, in a device 110 with multiple active electronic devices (120, 130, and 140), the connection between the active electronic devices may or may not be in a single plane—although FIG. 2 is a 2D drawing, one skilled in the art will recognize that the interconnect pattern can be in-plane (125), out-of-plane (135), an arbitrary direction (145), or any combination thereof (for example, 155).

Figure 4A:
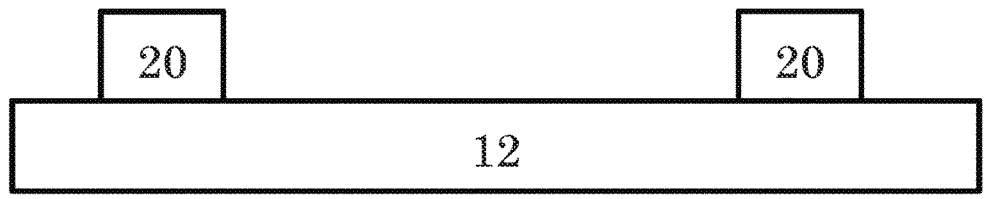
FIG. 4 is a diagram of several steps involved in one embodiment of the printing process for 3D printing an active electronic device.
Figure 4B:
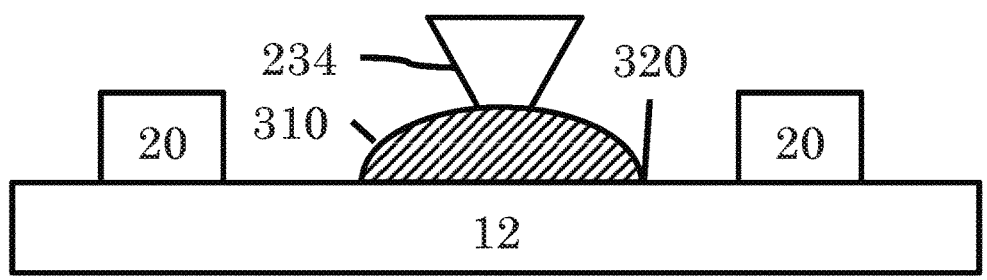
Figure 4C:
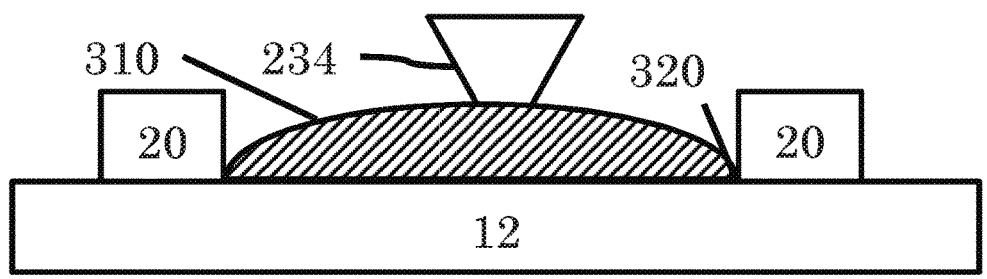

A specific use of the disclosed method involves making a quantum dot light emitting diode (QD-LED) with a 3D printer. This method requires printing circular rings 20 connected to contact pads on a substrate 12 using a conductive nanoparticle ink, as shown in FIG. 4A. One skilled in the art will recognize that this method may be used with a wide range of conductive nanoparticles, including, specifically, silver nanoparticles. The conductive nanoparticle ink is then annealed. As shown in FIG. 4B, a conductive polymer 310, such as PEDOT:PSS, is dispensed by nozzle 234 at approximately the center of the printed circular ring 20. This dispensing continues until, as shown in FIG. 4C, the contact line 320 touches the printed circular ring 20. The substrate is then heated. A solution comprising relatively low concentrations of a polymer, and specifically between about 0.05 and about 1.00 wt % of a hole-transport layer material, such as poly-TPD, in an orthogonal solvent, such as chlorobenzene, is then created. That solution is added to a syringe and dispensed, after which the material is annealed. QDs, such as CdSe/ZnS, in a co-solvent mixture, such as dichlorobenzene/toluene, are then dispensed onto the annealed poly-TPD; the QDs are then dried. A liquid metal, such as eutectic gallium indium ("EGaIn"), is then printed at approximately the center of the printed circular ring, and a UV adhesive is printed around the liquid metal to insulate it from the conductive nanoparticles the form the circular ring. The printed adhesive is then cured with a laser. A conductive silicone is then printed, and is then cured in an appropriate fashion. The final step in the disclosed embodiment is to print and cure a UV adhesive that encapsulates the printed QD-LED device.

Figure 5:
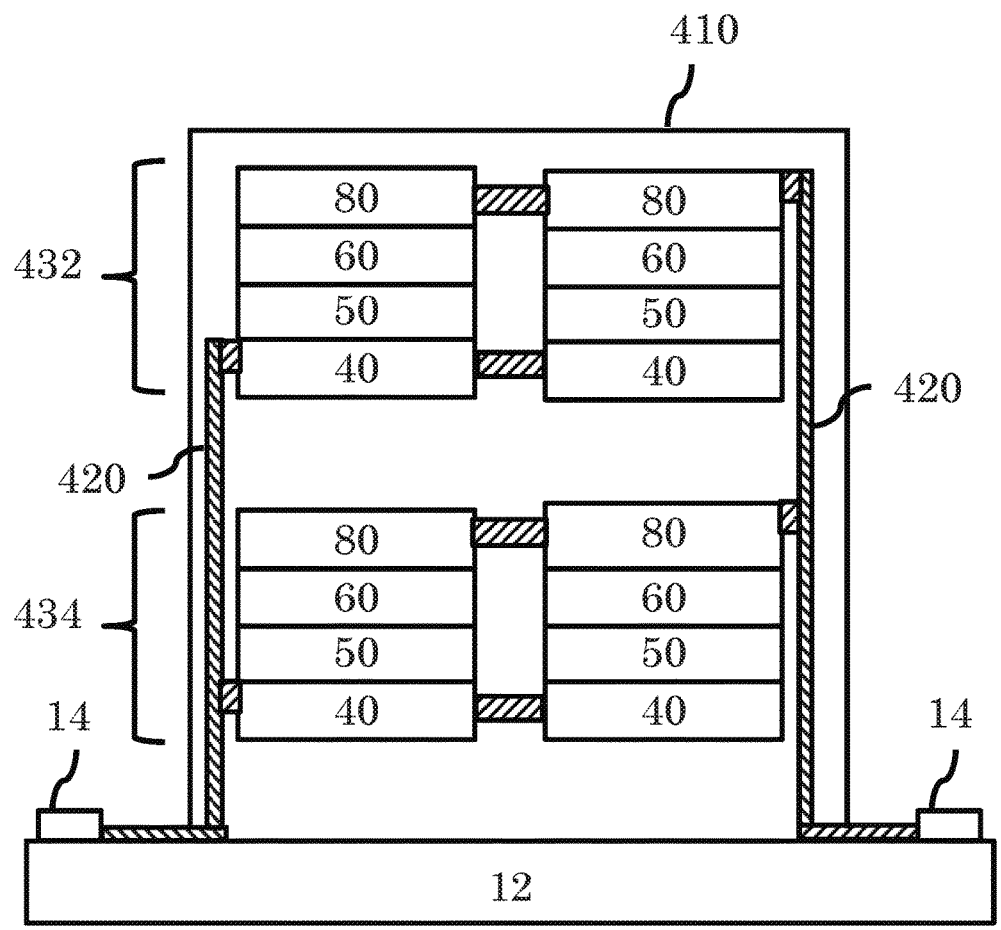
FIG. 5 is a diagram of an array of active electronic devices.

As shown in FIG. 5, this disclosed method may further involve printing conductive silicone as vertical interconnects (420) along with RTV silicone (410) to connect the exposed liquid metal (80) to the contact pads (14), and to connect the anode (40) and cathode (80) of different QD-LED (combination of 40, 50, 60, 80) layers (432, 434) so as to 3D print an array of QD-LEDs. Or, as discussed previously, it may involve scanning the surface using a 3D scanner to generate a geometrically faithful computer model of the surface, providing the computer model to the 3D printer, and then adjusting the 3D printing process to enable conformal 3D printing on a substrate having a non-flat, 3D surface, or alternatively on a flat surface which has structural elements on the surface, including but not limited to a rough or porous flat surface.

As one example of an embodiment of this invention, a regular glass slide was cleaned with water, acetone and isopropanol for 15 minutes each. Circular rings of 1.5 mm radius connected to contact pads were then printed using a synthesized AgNP ink. The anode ring was printed with a 3 cc syringe barrel through 33 ga nozzles (108 µm inner diameter) with a barrel pressure of 20 psi. The printer translation speed was maintained at 0.5 mm/s, and the distance between the nozzle tip and the substrate was kept at 85 µm. The printed silver was annealed at 200° C. for 3 hours. PEDOT:PSS (Sigma Aldrich, St. Louis, Mo.) was then dispensed at the center of the ring until the contact line touched the ring. The substrate was then heated to 150° C. for 15 minutes, which resulted in a transparent and conductive film. A 0.15 wt % poly-TPD (American Dye Source Inc, Quebec, Canada) solution in chlorobenzene was then dispensed and heated at 150° C. for 30 minutes. Subsequently, a 1 mg/ml of CdSe/ZnS QD solution with either green (Ocean NanoTech, San Diego, Calif.) or orange-red (Ocean NanoTech, San Diego, Calif.) in a co-solvent mixture was then dispensed onto the annealed poly-TPD. The printed QD droplet was allowed to evaporate completely without heating in a petri dish. Note that for printing of PEDOT:PSS, poly TPD and QDs, the ink was loaded into a 3 cc syringe barrel with a 32 ga nozzle. The nozzle was registered to position at the center of anode ring. Ink was prevented from dripping by applying a vacuum with a digital pressure regulator. During printing, the vacuum was turned off, the nozzle was lowered until the ink at the tip of the nozzle touched the substrate, and the position was held. The amount of ink extruded was controlled by controlling the hold-time, which corresponded in this example to an extrusion of approximately 0.8 µL. After printing, the nozzle was raised and vacuum was resumed to prevent dripping of the ink. Upon complete drying of QDs, EGaIn (Sigma Aldrich, St. Louis, Mo.) was then printed at the center of the ring with a digital pressure regulator to form a conformal liquid metal cathode. The 33 ga nozzle with a 3 cc barrel loaded with EGaIn was lowered to a gap of 100 µm from the surface of printed QD. A pressure of 4.5 psi was then applied for 3 seconds to print a hemispherical liquid cathode to cover the quantum dots. UV adhesive (Novacentrix, Austin, Tex.) was then printed through 33 ga nozzle, at a 50 µm gap with the printed anode, with a 5 mm/s translation speed around EGaIn to insulate it from the AgNP anode ring. The printed adhesive was then cured with a 405 nm laser attached to the 3D printer (Fig. S2C). Conductive silicone (Silicone Solutions, Cuyahoga Falls, Ohio) was then printed in order to contact the exposed printed EGaIn with a pad before it was left overnight to vulcanize completely. UV adhesive (Novacentrix, Austin, Tex.) was printed using the aforementioned parameters and cured with the 405 nm laser to encapsulate the printed QDLEDs.

The thicknesses of the individual layers was measured by profilometry to be the following: AgNP silver ring, 80 µm; PEDOT:PSS, 200-300 nm; poly-TPD, 100-200 nm; quantum dots, 100-150 nm; EGaIn, 2-3 mm. The QD-LED as fabricated was characterized with a source measure unit (Agilent, Santa Clara, Calif.), spectra were obtained with a spectrometer (Ocean Optics, Dunedin, Fla.), and the luminance was calibrated with a luminance meter (Konica Minolta, Ramsey, N.J.). All measurements were done under ambient conditions. The printed devices exhibited pure color emission from the QD emissive layer with narrow full-width at half-maxima (FWHM) of 43 nm for both colors. This is on par with the color purity from QD-LEDs made with established methods. The color quality, based on a chromaticity diagram which maps the range of physically produced colors to an objective description of color sensations by the average human. As indicated by the green (0.323, 0.652) and orange-red (0.612, 0.383) Commission International de l'Eclairage (CIE) 1931 chromaticity coordinates, the printed QD-LEDs generate highly saturated color emissions, which could enable the creation of displays that can subtend the color gamut at levels greater than the high-definition television standard.

As an alternative embodiment of the present invention, synthesized AgNPs were printed on a spin-coated device, where the spin-coated layers are similar to a previously published all-solution processed fabrication method. Unlike the case for the EGaIn cathode, we found that AgNPs require an additional electron transport layer to achieve electroluminescence. A 5 mg/ml solution of ZnO nanoparticles (Sigma Aldrich, St. Louis, Mo.) was printed and then heated with a hotplate at 150° C. for 30 minutes. The printed silver had a thickness of 80 µm, which was controlled by a combination of nozzle size (108 µm), printing speed (0.5 mm/s), gap height from the substrate (80 µm) and applied pressure. The ability to control the gap distance with a 3D printer is a critical factor in controlling the printing quality. If the gap is too small, excessive material would be squeezed out which would affect the planar resolution and annealing time; in contrast, when the gap is too large, the extruded material would not be continuously drawn to the substrate. In addition, it was found that careful control of both the annealing condition and printing pattern are important in achieving sintering of the AgNPs without damaging the underlying layer. A slow temperature ramping rate (10° C./min) and a spiral design were found to be necessary to provide a sufficient surface-area-to-volume ratio for removal of the solvent (water, ethylene glycol and polyacrylic acid) at a rate that causes insignificant damage to the underlying film. With a slow ramping rate and spiral design, a conductive cathode was formed. Once the parameter for cathode printing and sintering had been determined, the printing conditions for poly-TPD and PEDOT:PSS were optimized with a similar approach as described previously. The fully printed design consisted of a printed AgNP cathode and anode that achieved a luminance of 11 cd/m$^2$ at 13 V. It should be noted that in this example, for the desired purpose of the device, the performance with the AgNP-based cathode was unsatisfactory by comparison with the EGaIn cathode for the following reasons. First, the printing of silver requires heating of 200° C. for a minimum of 1 hour for its sintering process, which damages the underlying layers when it is printed as a cathode under ambient conditions. Second, although bulk silver has a work function of −4.3 eV, AgNPs have large surface-to-volume ratios which allows them to be easily oxidized to silver oxide, which has a work function of −5.0 eV In another example, polyimide tape (McMaster-Carr, Robbinville, N.J.) was attached to a glass slide. Commercially available AgNP dispersed in tetradecane (Sigma Aldrich, St. Louis, Mo.) was printed into a circular conductive ring (32 ga nozzle, 100 μm gap, 5 mm/s). The tape and conductive ring were then heated to 200° C. for an hour to achieve a resistivity of 2.7 μΩ·cm. The subsequent layer of QD-LED was then printed as described earlier, with modification of the solvent-co-solvent ratio and QD concentrations. The QD-LED on the polyimide tape was then peeled slowly from the glass slide and reattached to different substrates.

Figure 3:
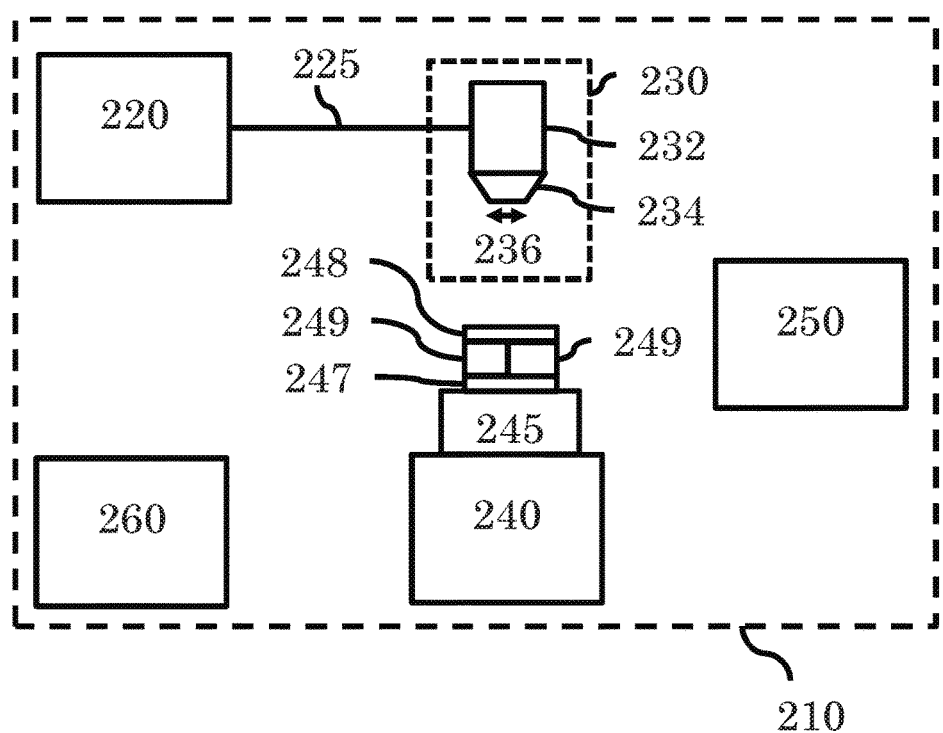
FIG. 3 is a block diagram of an embodiment of a 3D printer capable of printing active electronic devices.

The present invention also discloses a 3-D Printer adapted for printing these disclosed active electronic devices. As shown in FIG. 3, the printer 210 comprises a plurality of material dispensing units 230, each of which comprise a material storage location 232 and a nozzle 234. The material storage location 232 includes any configuration where the material to be deposited is stored that can be accessed by the printer, and may include, but is not limited to, ink cartridges, filament spools, or syringe barrels. The material storage location 232 is then connected to a nozzle 234, either directly, such as a syringe barrel 232 directly connected to the syringe nozzle 234 or a filament spool that feeds thermoplastic filaments directly to the nozzle, or indirectly, such as from an ink cartridge through tubes or hoses to the nozzle. The nozzle 234 may have a predetermined nozzle tip size 236. The printer also comprises a printer stage 245 located under the plurality of nozzles, and a heating and cooling unit 240 for the printer stage 245. Utilizing positive or negative pressure controlled by pressure regulation unit 220, the nozzles deposit ink onto the stage, a substrate (247) on the stage, or similar, and the heating and cooling units 245 control the temperature as the ink is being printed and as it is being cured or processed after the ink is deposited. To control where the printing occurs, the entire stage, or part of the stage, may move in one or more directions. Alternatively, or in combination with a moving stage, the nozzle or nozzles may move in one or more directions, independently or as a group. The entire stage, and possibly the stage and the syringes, may be enclosed by a cover or shield While a single regular can control multiple nozzles, through multiplexing, other configurations may be desirable. For example, a separate regulator may be provided for each nozzle, each regulator controlling the pressure for a single nozzle. Alternatively, other arrangements may be desirable, such as basing the number of regulators on the level of control required by the viscosity of the materials to be printed. For example, as part of the pressure regulation unit 220, the printer may use multiple pressure regulators—a first pressure regulator that is connected to at least one syringe via tubes or hoses 225, and a second pressure regulator that may be required to regulate the deposition of inks having a viscosity within a predetermined viscosity range.

The printer may also require a UV laser, typically for use in UV curing applications. The printer may incorporate a vision system 250 focused on the area on and around the stage 245. Additionally, the printer may require a robot controller unit 260 for controlling various aspects associated with the printing process. This may involve connections (electric, wireless, or some other connection method) with associated units, including but not limited to the pressure regulator unit 220, the material dispensing units 230, the heating and/or cooling units 240, the platform 245, or the vision system 250, or with a separate, stand alone computer.

As one example of this, an industrial robotic dispenser (Fisnar, Wayne, N.J.) was modified into a multi-head 3D printer, where up to four different inks can be loaded and independently controlled with an external I/O card and pressure regulators. The printer supports standard size syringe barrels, and universal luer-lock needles. Tips from 27 to 33 gauge (GA) have been used depending on the material viscosity and resolution required. For high precision printing, the barrel pressure was regulated from 0 to 100 psi with a digital pressure regulator (Nordson Corporation, Westlake, Ohio). Vacuum suction control of the regulator was used to prevent dripping of low viscosity fluids. Higher viscosity inks were independently regulated with analog pressure regulators (Fisnar, Wayne, N.J.) for multi-material printing. The distance registration was calibrated with a digital CMOS laser sensor (Keyence, Itasca, Ill.), and the printer stage has a maximum resolution of 1 μm per axis. Control of the 3D printer was achieved via custom written LabVIEW programs through serial connection. Commercially available CAD software, Solidworks Premium 2014 (Dassault Systèmes, Vélizy-Villacoublay Cedex, France) was used for all modeling applications. The typical printing strategy involved the formatting of 3D CAD files into stereolithography (STL) format, followed by slicing the model into G-code coordinates. The G-code was then translated to the command language of the robotic dispenser via a custom written LabVIEW program. In some instances, a Peltier stage heater was used and the temperature was modulated with the applied voltage to optimize the printing condition or for annealing the printed film. A UV laser (405 nm) was also integrated to the printer arm to provide curing of photoactive materials, such as the UV adhesive.

Various modifications and variations of the invention in addition to those shown and described herein will be apparent to those skilled in the art without departing from the scope and spirit of the invention, and fall within the scope of the claims. Although the invention has been described in connection with specific preferred embodiments, it should be understood that the invention as claimed should not be unduly limited to such specific embodiments.

What is claimed:

1. A method of making a device, comprising the steps of:
    providing an ink comprising semiconductor particles;
    extruding the ink comprising semiconductor particles to form at least one active electronic layer via 3D printing;
    providing a conductive ink; and
    extruding the conductive ink to form at least one conductive pattern via 3D printing,
    wherein the at least one conductive pattern is adapted to allow an electric potential to be applied across the active electronic layer.

2. The method according to claim 1, further comprising 3D printing at least one of an elastomeric matrix, organic polymers as charge transport layers, solid or liquid metal leads, nanoparticle semiconductors, or a UV-adhesive transparent substrate layer.

3. The method according to claim 1, further comprising:
    identifying at least one material of an electrode, semiconductor, or polymer that possesses desired functionalities and exists in a printable format; and
    patterning of the at least one identified material via direct dispensing from a computer aided design (CAD)-designed construct onto a substrate.

4. The method according to claim 3, further comprising:
    scanning the topology of the surface of the substrate; and providing information derived from the scanning step into the computer aided design (CAD) design of the device for conformal 3D printing.

5. The method according to claim 4, wherein the substrate comprises a contact lens.

6. The method according to claim 5, wherein electronics printed on the contact lenses provides a wearable display and/or a continuous on-eye glucose sensor.

7. The method according to claim 4, wherein the substrate comprises at least one of a flat substrate, a non-flat substrate, a biological substrate, a glass substrate, a polyamide film, and a 3D printed substrate.

8. The method according to claim 3, wherein the device is an active device from among quantum dot light-emitting diodes (QD-LEDs), MEMS devices, transistors, solar cells, piezoelectrics, batteries, fuel cells, and photodiodes.

9. The method according to claim 3, incorporating other classes of nanoscale functional building blocks and devices, including metallic, semiconductor, plasmonic, biological, and ferroelectric materials.

10. The method according to claim 3, wherein the active electronic layer is printed by a method comprising the steps of: providing a syringe with a predetermined nozzle tip size, loading the ink comprising the semiconducting particles into the syringe, placing the syringe under vacuum, turning off the vacuum, lowering the syringe until the ink at the nozzle tip touches the substrate, holding the syringe in place for a predetermined period of time, and raising the syringe and placing the syringe under vacuum.

11. The method according to claim 3, further comprising printing a conductive pattern connecting the active electronic layer and a second active electronic layer.

12. The method according to claim 3, further comprising dissolving or suspending the at least one material in a composition comprising an orthogonal solvent.

13. The method according to claim 12, wherein the composition further comprises a second orthogonal solvent.

14. The method according to claim 12, wherein the at least one material is present in the composition at between about 0.02 wt % and about 0.20 wt %.

15. A method of making a quantum dot light emitting diode (QD-LED) with a 3D printer, comprising:
   printing circular rings connected to contact pads on a substrate using a conductive nanoparticle ink;
   annealing the printed conductive nanoparticles;
   dispensing a conductive polymer at approximately the center of the printed circular ring until a contact line defining the outer perimeter of the conductive polymer touches the printed circular ring;
   heating the substrate;
   dispensing and annealing a solution comprising between about 0.05 and about 0.20 wt % Poly(N,N'-bis-4-butylphenyl-N,N'-bisphenyl)benzidine (poly-TPD) in chlorobenzene;
   dispensing CdSe/ZnS QDs in a co-solvent mixture onto the annealed poly-TPD;
   drying the QDs;
   printing a liquid metal at approximately the center of the printed circular ring;
   printing an ultraviolet (UV) adhesive around the liquid metal to insulate it from the conductive nanoparticle ink;
   curing the printed adhesive with a laser;
   printing conductive silicone; and
   printing and curing UV adhesive to encapsulate the printed QD-LED.

16. The method according to claim 15, further comprising:
   printing conductive silicone as vertical interconnects along with room temperature vulcanization (RTV) silicone to connect the exposed liquid metal to the contact pads and to connect the anode and cathode of different QD-LED layers so as to 3D print an array of QD-LEDs.

17. The method according to claim 15, further comprising:
   scanning the surface using a 3D scanner to generate a geometrically faithful computer model of the surface;
   providing the computer model to the 3D printer, and adjusting the 3D printing process to enable conformal 3D printing on a substrate having a non-flat, 3D surface or a flat surface which has structural elements on the surface.

18. The method according to claim 15, wherein the conductive nanoparticle is comprised of silver, the conductive polymer is poly(3,4-ethylenedioxythiophene) polystyrene sulfonate (PEDOT:PSS), and the liquid metal is EGaIn.

* * * * *